United States Patent
Yoneda

(10) Patent No.: US 6,717,069 B2
(45) Date of Patent: Apr. 6, 2004

(54) SURFACE-MOUNTING SUBSTRATE AND STRUCTURE COMPRISING SUBSTRATE AND PART MOUNTED ON THE SUBSTRATE

(75) Inventor: Yoshihiro Yoneda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/820,470

(22) Filed: Mar. 29, 2001

(65) Prior Publication Data

US 2001/0030061 A1 Oct. 18, 2001

(30) Foreign Application Priority Data

Mar. 30, 2000 (JP) .......................... 2000-95137

(51) Int. Cl.⁷ ..................... H05K 1/11; H01R 12/04
(52) U.S. Cl. ............... 174/262; 174/255; 174/260; 174/261; 174/264; 361/760; 361/792; 361/767; 361/772; 257/737; 257/778; 257/779
(58) Field of Search ............ 174/262, 264, 174/261, 260, 255; 361/760, 792, 794, 795, 767, 772, 779, 774, 783; 257/698, 737, 778, 779

(56) References Cited

U.S. PATENT DOCUMENTS

| | | | |
|---|---|---|---|
| 5,375,042 A | * 12/1994 | Arima et al. | 361/784 |
| 5,451,721 A | * 9/1995 | Tsukada et al. | 174/261 |
| 5,488,542 A | * 1/1996 | Ito | 174/259 |
| 5,519,176 A | * 5/1996 | Goodman et al. | 174/255 |
| 5,633,479 A | * 5/1997 | Hirano | 174/255 |
| 5,726,863 A | * 3/1998 | Nakayama et al. | 174/255 |
| 5,796,165 A | * 8/1998 | Yoshikawa et al. | 257/698 |
| 5,841,190 A | * 11/1998 | Noda et al. | 257/668 |
| 5,889,326 A | * 3/1999 | Tanaka | 257/737 |
| 5,936,843 A | * 8/1999 | Ohshima et al. | 174/250 |
| 6,074,728 A | * 6/2000 | Ryu | 428/209 |
| 6,184,477 B1 | * 2/2001 | Tanahashi | 174/261 |
| 6,197,407 B1 | * 3/2001 | Andou et al. | 428/209 |
| 6,242,815 B1 | * 6/2001 | Hsu et al. | 257/780 |
| 6,255,600 B1 | * 7/2001 | Schaper | 174/255 |
| 6,274,821 B1 | * 8/2001 | Echigo et al. | 174/255 |
| 6,329,610 B1 | * 12/2001 | Takubo et al. | 174/255 |
| 6,351,031 B1 | * 2/2002 | Iijima et al. | 257/635 |

FOREIGN PATENT DOCUMENTS

| | | |
|---|---|---|
| JP | 9223715 | 8/1997 |
| JP | 10013003 | 1/1998 |

\* cited by examiner

*Primary Examiner*—David L. Talbott
*Assistant Examiner*—J B Patel
(74) *Attorney, Agent, or Firm*—Paul & Paul

(57) ABSTRACT

A surface-mounting substrate, for mounting thereon a part such as a semiconductor device, which comprises a core substrate, a plurality of layers of patterned wiring lines, which are separated from each other by an insulation layer interposed therebetween, vias piercing through the insulation layer to connect the wiring lines at the adjacent layers to each other, and a layer of connecting terminals to mount a part on the surface-mounting substrate, each of the connecting terminals connecting with the wiring line at the outermost layer of wiring lines, wherein the connecting terminal is filled in an outermost insulation layer provided at the surface of the surface-mounting substrate, and has a surface exposed at substantially the same level as the level of the surface of the outermost insulation layer. A structure comprising a surface-mounting substrate and a part mounted thereon, which comprises, as the substrate used, the surface-mounting substrate of the invention, is also disclosed.

29 Claims, 18 Drawing Sheets

SURFACE-MOUNTING SUBSTRATE AND STRUCTURE COMPRISING SUBSTRATE AND PART MOUNTED ON THE SUBSTRATE

BACKGROUND OF THE INVENTION

1. Field of the Invention

The invention relates to a surface-mounting substrate for mounting thereon a part, such as a semiconductor device, and a structure comprising a substrate and a part surface-mounted thereon.

2. Description of the Related Art

As a substrate for mounting thereon a part, such as a semiconductor device, there have been provided a product having a laminate structure of an insulation layer(s) and a patterned wiring line layer(s) on at least a side of a core substrate.

Such a substrate is illustrated in FIG. 20, which is a plan view of a substrate for mounting a semiconductor device (not shown) by flip chip bonding, the substrate having connecting terminals 10 arranged on a surface of the substrate so as to be spaced from each other and to form an array of the terminals 10.

FIG. 21 illustrates a construction of the laminate structure of electrical insulation layers and patterned wiring line layers provided on a core substrate 20. The laminated structure comprises first and second inner wiring line layers 12a, 12b, and an outermost wiring line layer 12, which are formed so as to have certain patterns. The first inner wiring line layer 12a is provided on a side of the core substrate 20, and the second inner layer 12b and the outermost wiring layer 12 are separated from the first inner layer 24a and the second inner layer 24b by insulation layers 22a and 22b, respectively. The wiring lines in the adjacent layers are connected to each other by vias 12a, 12b which are formed in the respective insulation layers 22a, 22b. A through hole 26 is formed in the core substrate 20, and effectively employed for substrates having connecting terminals arranged at a small pitch of, for instance, 100 micrometers or less.

The connecting terminal 10 is formed in an elongated shape, as clearly seen in FIG. 20. The site of the terminal 10, to which an electrode terminal of a semiconductor device (not shown) is to be bonded, is at the end portion of the terminal 10 (i.e., on the line X–X' in the drawing). The reason why the connection terminal 10 is formed in an elongated shape is that variation in the amount of solder to be coated to the respective connecting terminals 10 must be restrained to reliably bond the electrode terminal of a semiconductor device to the connecting terminal 10 of the substrate.

The coating of the solder 14 to the surface of the connecting terminal 10 is carried out by a method in which a powder of solder is placed on the connecting terminal 10, and flux is then applied to the solder, after which the solder is coated to the terminal 10 by a reflow process. The method of coating solder to a connecting terminal using a powder of solder is effectively employed for substrates having connecting terminals arranged at a small pitch of, for instance, 100 micrometers or less.

However, when the connecting terminals 10 are arranged with a smaller gap, such as about 30 micrometers, a problem that solder materials on adjacent terminals 10 form bridges when they are fused in a reflow process, resulting in short-circuit between the adjacent terminals 10, arises. FIG. 22 illustrates a mounting substrate having a bridge structure 14a of solder materials on the adjacent connecting terminals 10, which is formed during a reflow process. In conventional surface-mounting substrates, the side faces of the connecting terminal 10 are exposed, and the solder material 14 provided on the top surface of the terminal 10 can be coated not only to the top surface of the terminal 10 but also to the exposed side faces thereof during a reflow process. Short-circuits between the adjacent terminals 10 due to such bridge structures of solder materials tend to occur when the space between adjacent terminals 10 becomes smaller.

In addition, conventional surface-mounting substrates also have a problem that variation in the thicknesses (heights) of the connecting terminals 10 causes variation in the amounts of solder materials on the terminals 10, which in turn causes variation in the heights of the solder materials after coated to the terminals 10.

These problems cannot be overlooked in order to provide a miniaturized semiconductor product having an increased number of pins by which the product is to be mounted on a substrate.

Conventional surface-mounting substrates further have a problem that inner layers of patterned wiring lines in a build-up structure are designed based only on wiring schemes, line widths, and line gaps in the respective layers, without considering densities of lines in the respective layers, and, accordingly, the thickness of an insulation layer formed on a layer of wiring lines is varied from a region located on the region of wiring lines at a higher density to a region located on the region of wiring lines at a lower density, which results in poor planarity at the top surface of a product substrate. When flip chip bonding is used to mount a semiconductor device on a substrate, poor planarity at a region of the substrate on which the device is to be mounted gives rise to a problem of unsatisfactory bonding between the semiconductor device and the substrate.

SUMMARY OF THE INVENTION

An object of the invention is to solve the above problems by providing a substrate for surface-mounting a semiconductor device thereon, in which electrical short-circuits between connecting terminals due to bridging of solder materials coated to the terminals can be prevented, even when the connecting terminals are arranged at a very small distance, and variation in thicknesses of the solder materials due to variation in thickness (height) of the terminals can be also prevented, to thereby improve reliability of electrical connections in a structure comprising a substrate and a semiconductor device mounted thereon, and which substrate can also improve reliability of the mounting of semiconductor device by its surface having a good planarity for mounting the device thereon. It is also an object of the invention to provide a structure comprising such a substrate and a semiconductor device or the like mounted thereon.

According to the invention, there is provided a surface-mounting substrate for mounting thereon a part, such as a semiconductor device, which comprises a core substrate, a plurality of layers of patterned wiring lines, which are separated from each other by an insulation layer interposed therebetween, vias piercing through the insulation layer to connect the wiring lines at the layers adjacent to each other, and a layer of connecting terminals to mount a part on the surface-mounting substrate, each of the connecting terminals connecting with the wiring line at the outermost layer of wiring lines, wherein the connecting terminal is filled in an outermost insulation layer provided at the surface of the surface-mounting substrate, and has a surface exposed at substantially the same level as the level of the surface of the outermost insulation layer.

The surface-mounting substrate of the invention may be provided on the surface of each of the connecting terminals with a conductor material, such as a solder material, bonded thereto.

In an embodiment of the surface-mounting substrate according to the invention, the layer of the connecting terminals is separated from the outermost layer of wiring lines by an insulation layer interposed therebetween, and the connecting terminal is connected with the wiring line at the outermost layer of wiring lines through a via piercing through the insulation layer separating the layer of the connecting terminals from the outermost layer of wiring lines.

In another embodiment of the surface-mounting substrate according to the invention, the connecting terminal is directly connected with the wiring line at the outermost layer of wiring lines located under the layer of connecting terminals.

In a further embodiment of the surface-mounting substrate according to the invention, the connecting terminal is directly connected with the wiring line at the outermost layer in the surface-mounting substrate, and the wiring lines at the outermost layer is covered with a cover material.

Preferably, the connecting terminals are arranged at a pitch of 100 micrometers or smaller and at a spacing distance of 20 micrometer or larger.

In the surface-mounting substrate of the invention, conductive members in an area, over which the part is mounted, of the outermost layer of wiring lines connected with the connecting terminals may be arranged at a uniform density as a whole. The conductive members include the wiring lines and the connecting terminals, and, if any, other conductive members, such as a power supply plane and a grounding plane.

Preferably, conductive members in the area, over which the part is mounted, of each of the layers of wiring lines located below the outermost layer of wiring lines connected with the connecting terminals are arranged at a uniform density as a whole. The conductive members include the wiring lines and the vias, and, if any, other conductive members, such as a power supply plane and a grounding plane. More preferably, the conductive members at each of the layers of wiring lines below the outermost layer of wiring lines are arranged at substantially the same density as the density of conductive members at the outer most wiring lines.

The surface-mounting substrate may have dummy members at at least one of layers of wiring lines, so as to exclusively contribute to equalization of density of wiring lines thereat.

The surface-mounting substrate may also comprise a common plane, such as a power supply plane or a grounding plane, located at at least one of the layers of wiring lines, the common plane being in a mesh-like shape or having slits.

In general, the wiring lines have a width of 20 to 200 micrometers, and are arranged at a pitch of 60 to 300 micrometers.

In general, the vias have a diameter of 0.05 to 0.6 millimeter.

The core substrate may have through holes to connect a wiring line at one side of the substrate to another wiring line at the other side, the through holes having, in general, a diameter of 0.2 to 0.6 millimeter, and being arranged in a pitch of 0.5 to 1.5 millimeters.

In a case such that the problem of poor planarity of the surface of a surface-mounting substrate at a region on which a part, such as a semiconductor device, is to be mounted is to be solved chiefly or exclusively, the surface-mounting substrate of the invention is simply characterized in that conductive members in an area, over which the part is mounted, of an outermost layer of wiring lines are arranged at a uniform density as a whole. Thus, in another aspect, the invention provides a surface-mounting substrate for mounting a part thereon, which comprises a core substrate, a plurality of layers of patterned wiring lines, which are separated from each other by an insulation layer interposed therebetween, vias piercing through the insulation layer to connect the wiring lines at the adjacent layers to each other, and a layer of connecting terminals to mount a part on the surface-mounting substrate, wherein conductive members in an area, over which the part is mounted, of an outermost layer of wiring lines are arranged at a uniform density as a whole.

The invention also provides a structure comprising a surface-mounting substrate and a part mounted thereon, the surface-mounting substrate comprising a core substrate, a plurality of layers of patterned wiring lines, which are separated from each other by an insulation layer interposed therebetween, vias piercing through the insulation layer to connect the wiring lines at the adjacent layers to each other, and a layer of connecting terminals to mount the part on the surface-mounting substrate, each of connecting terminals connecting with the wiring line at the outermost layer of wiring lines, and the part having bumps, and being mounted on the substrate through the bumps bonded to the respective connecting terminals, wherein the connecting terminal of the surface-mounting substrate is filled in an outermost insulation layer provided at the surface of the surface-mounting substrate, and has a surface exposed at substantially the same level as the level of the surface of the outermost insulation layer.

The invention further provides a structure comprising a surface-mounting substrate and a part mounted thereon, the surface-mounting substrate comprising a core substrate, a plurality of layers of patterned wiring lines, which are separated from each other by an insulation layer interposed therebetween, vias piercing through the insulation layer to connect the wiring lines at the adjacent layers to each other, and a layer of connecting terminals to mount a part on the surface-mounting substrate, wherein conductive members in an area, over which the part is mounted, of an outermost layer of wiring lines are arranged at a uniform density as a whole.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Figure 1:
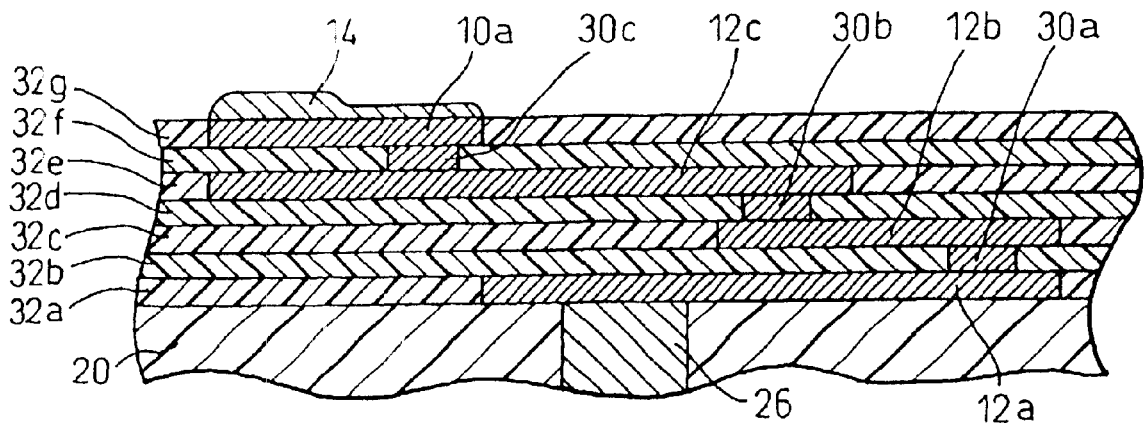
FIG. 1 is an illustration of a first embodiment of the surface-mounting substrate according to the invention.

FIG. 1 illustrates a first embodiment of the surface-mounting substrate according to the invention. In the drawing, reference numeral 20 indicates a core substrate; 10a indicates a connecting terminal provided in the surface layer of the surface-mounting substrate; 32a, 32b, 32c, 32d, 32e, 32f, and 32g indicate insulation layers; 12a, 12b, and 12c indicate inner layers of patterned wiring lines; 30a, 30b, and 30c indicate vias connecting wiring lines in adjacent layers with each other; and 14 indicates a solder material coated to the surface of the connecting terminal 10a.

The surface-mounting substrate of this embodiment has a characteristic construction in that the inner layers 12a, 12b, 12c of wiring lines, the vias 30a, 30b, 30c, and the connecting terminal 10a are formed by a fully-additive process, in which conductive members are formed only by electroless plating, and which is characterized by enabling thicknesses of films of the conductive members to be accurately controlled by adjusting a duration of plating and the like. In a fully-additive process, a conductor pattern, such as of a wiring line or a via, is formed by applying a photoresist (photosensitive resin material), which is subsequently made into an insulation layer, on a core substrate in a certain thickness to form a resist layer, exposing and developing the resist layer to form a patterned hole (also called a via hole) piercing through the layer, and depositing a plated conductor material within the patterned hole by electroless plating.

On the other hand, the coating of the solder material to the surface of the connecting terminals 10a is performed by a conventional process in which powder of solder material is placed on the connecting terminals 10a, and flux is then applied to the solder material, after which the solder material is subjected to a reflow process, for example.

As described above, the built-up layers shown in FIG. 1 are formed by successively building up respective patterned conductor layers by such a fully-additive process. The patterned wiring lines 12a, 12b, 12c, the vias 30a, 30b, 30c, and the connecting terminal 10a are respectively formed to have the same thicknesses as those of the insulation layers 32a to 32g by depositing a plated conductor material within patterned holes provided in the respective insulation layers, and to be filled in the holes. The vias 30a, 30b, 30c allow the patterned wiring lines 12a, 12b, 12c to be certainly connected directly or indirectly to the connecting terminal 10a by the plated materials filled in the via holes provided in the insulation layers, and have flat top faces without a cave-in, which is the case with a via unfilled with a conductor material, to thereby makes it possible to prevent undulation from being developed at the surface of the insulation layers formed thereon.

Figure 2:
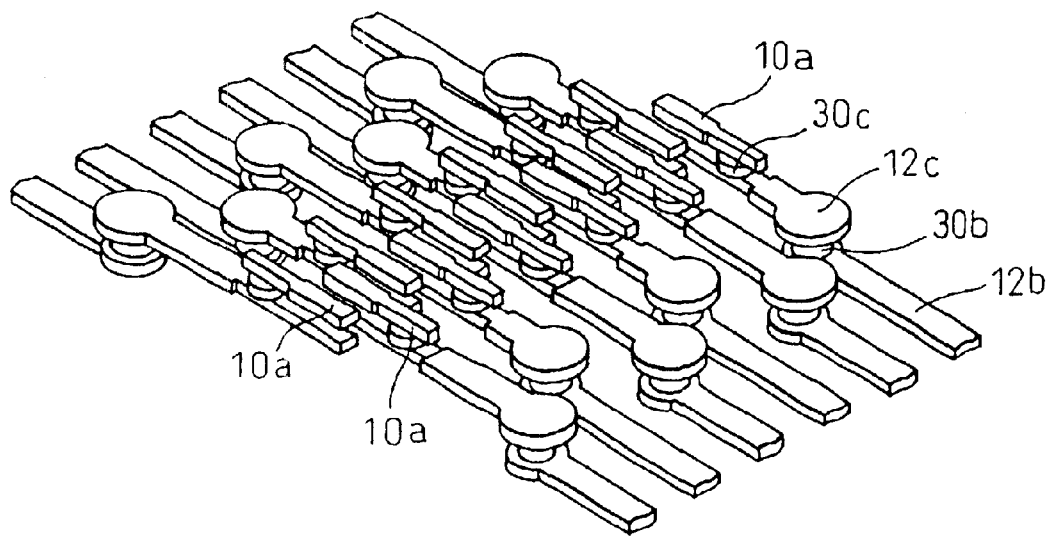
FIG. 2 is a partial perspective view of the arrangement of patterned conductor materials in the substrate illustrated in FIG. 1.
Figure 20:
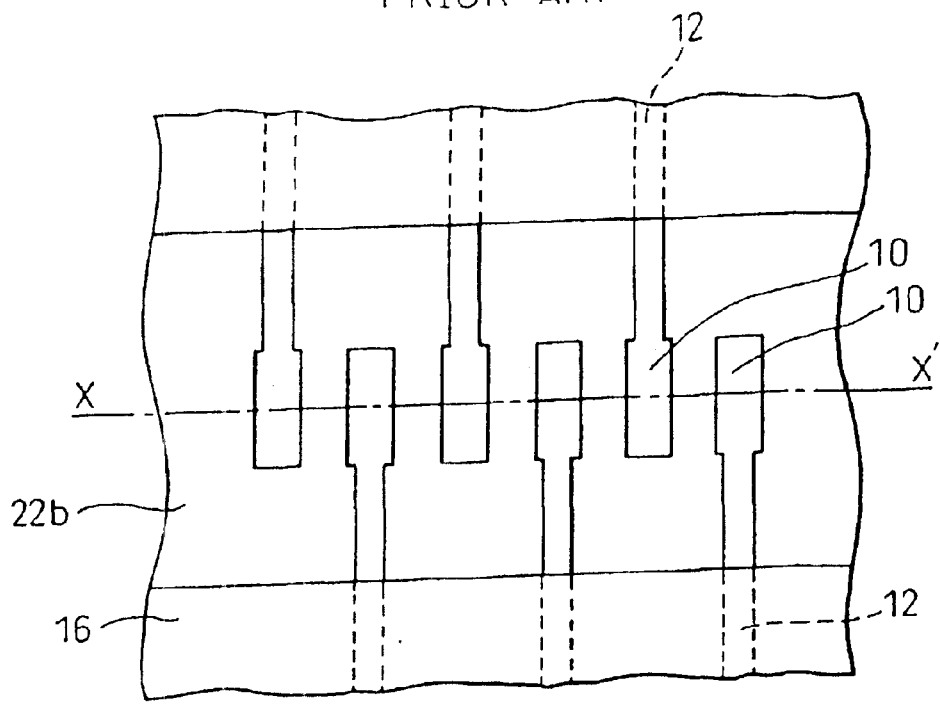
FIG. 20 is a partial plan view of a conventional substrate.

FIG. 2 perspectively illustrates, in part, the arrangement of the patterned conductor materials in the embodiment shown in FIG. 1. The insulation layers formed to fill the spaces among the patterned conductor materials, which are seen in FIG. 1, are not shown in FIG. 2 for simplicity. The connecting terminals 10a at the uppermost layer are connected to the underlying wiring lines 12c through the respective vias 30c, and the wiring lines 12c are connected to the underlying wiring lines 12b through the respective vias 30b. The connecting terminals 10a are arranged in parallel in the longitudinal direction, as in the conventional substrate illustrated in FIG. 20.

Figure 3:
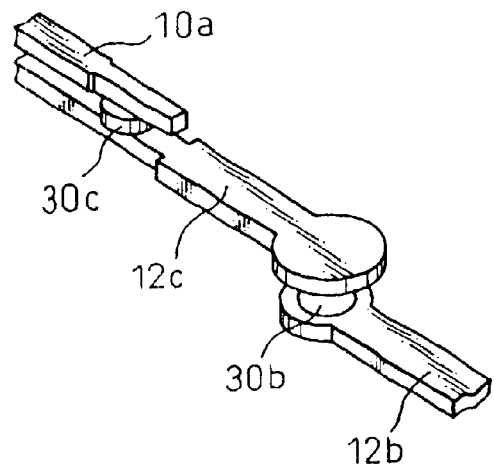
FIG. 3 shows the connection of a connecting terminal to underlying wiring lines in the substrate illustrated in FIG. 1.

The connection of the connection terminal 10a to the wiring lines 12b, 12c in the lower layers is shown in FIG. 3, in which the insulation layers formed to fill the spaces among the terminal and the wiring lines are also not shown for simplicity.

In the surface-mounting substrate of the present embodiment, only top faces of the connecting terminals 10a are exposed at the surface of the substrate on which a semiconductor device is to be mounted, and no conductive members are exposed. In addition, the top faces of the terminals 10a and the surface of the outermost insulation layer 32g are located at substantially the same plane, and the sides of the terminals 10a are buried in the insulation layer 32g. Accordingly, a powder of solder material placed on the surfaces of the connecting terminals 10a is not reflowed and coated to the sides of the terminals 10a during a reflow process for the coating of the solder material to the terminals 10a, so that short-circuit between the adjacent connecting terminals due to bridging of solder materials coated to the sides of the terminals can be effectively prevented.

As used herein, the term "substantially the same plane" (or "substantially the same level") means that the top face of the connecting terminal is at a plane (or level) which is the same as or close to the plane (or level) of the surface of the outermost insulation layer of the surface-mounting substrate, so that the solder materials on the top faces of the adjacent connecting terminals remain there and are kept separate from each other after the reflowing of the solder materials.

Figure 4:
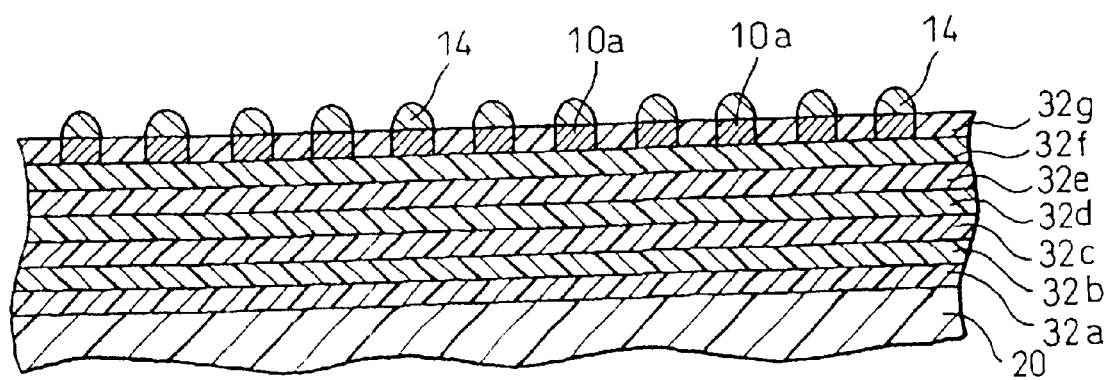
FIG. 4 is an illustration of the substrate illustrated in FIG. 1, showing solder materials on connecting terminals.

FIG. 4 illustrates a mounting substrate having solder materials 14 coated to the top face of the connecting terminals 10a. By coating the solder materials 14 only to the exposed top faces of the terminals 10a, lateral spreading of the solder materials 14 beyond the periphery of the terminals 10a is prevented, and short-circuits between the adjacent terminals 10a through bridged solder materials is also prevented. In the case where the sides of the connecting terminals 10a are buried in the insulation layer 32g and only the top faces of the terminals 10a are exposed, as described above, it is possible to adequately prevent the short-circuit between the adjacent connecting terminals 10a even when the terminals 10a are arranged at a pitch of not greater than 100 micrometers and at a spacing distance of the order of 20 micrometers. Also in this case, the coating of the solder materials 14 only to the top face of the connecting terminals 10a allows variation in thicknesses of the terminals 10a to be neglected, and makes it possible to solve a problem of variation in the amounts of solder materials 14 coated to the terminals 10a due to variation in thicknesses of the terminals 10a.

Figure 5:
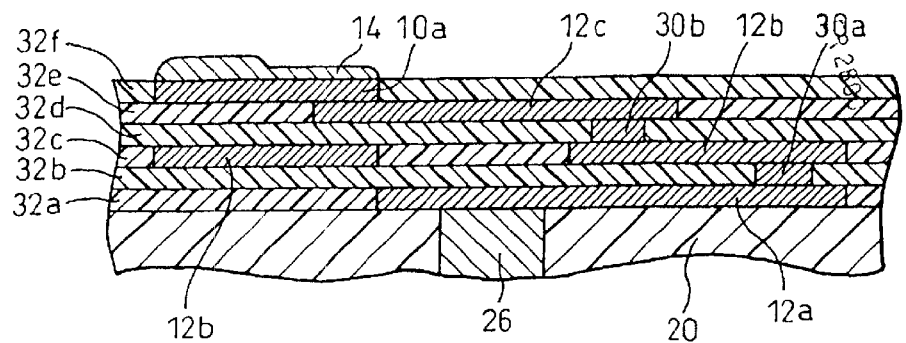
FIG. 5 is an illustration of a second embodiment of the surface-mounting substrate according to the invention.

FIG. 5 illustrates a second embodiment of the surface-mounting substrate according to the invention. Unlike the former embodiment in which the connecting terminals 10a formed in the surface layer (outermost insulation layer) 32g are connected to the underlying layer 12c of patterned wiring lines through the vias 30c, this embodiment is characterized in that the connecting terminals 10a are connected directly to the underlying layer 12c of wiring lines without vias interposed therebetween.

In this embodiment, the inner layers 12a, 12b, 12c of patterned wiring lines, the vias 30a, 30b, and the connecting terminals 10a are also formed by a fully-additive process, as in the former embodiment. Thus, the wiring lines 12a, 12b, 12c, vias 30a, 30b, and the connecting terminals 10a are formed to have the same thicknesses as those of the respective insulation layers 32a to 32f.

Figure 6:
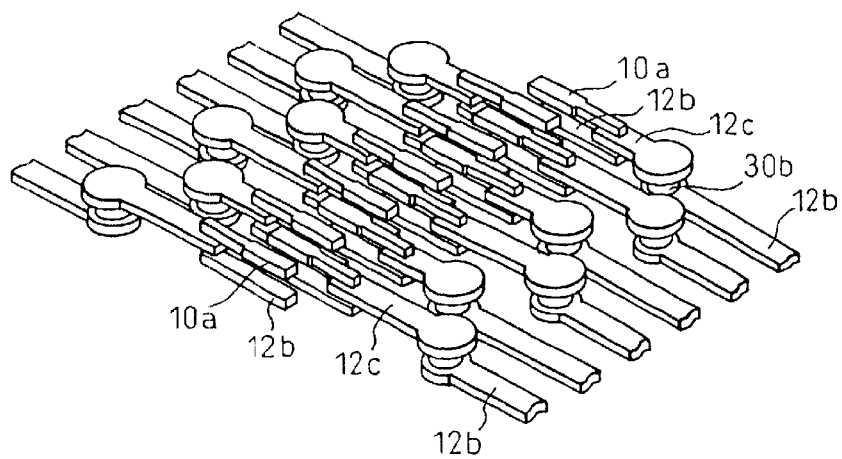
FIG. 6 is a partial perspective view of the arrangement of patterned conductor materials in the substrate illustrated in FIG. 5.

FIG. 6 perspectively illustrates, in part, the arrangement of the patterned conductor materials in the embodiment shown in FIG. 5. The insulation layers formed to fill the spaces among the patterned conductor materials, which are seen in FIG. 5, are also not shown in FIG. 6 for simplicity. The planar arrangement of the connecting terminals 10a is the same as that in the first embodiment earlier described.

In the second embodiment, the top face of the connecting terminals 10a and the surface of the outermost insulation layer 32f are also located at the same plane, and the connecting terminals 10a are exposed only at the top faces and have the sides buried in the insulation layer 32f. Accordingly, this embodiment can provide the same effects as those obtained in the first embodiment.

In the second embodiment, since the connecting terminals 10a are connected directly to the wiring lines 12c in the underlying layer, vias for connecting the two members with each other, such as vias 30c in the embodiment illustrated in FIG. 1, are not necessary, which can facilitate operation for the formation of the layers of wiring lines by a fully-additive process.

Figure 7:
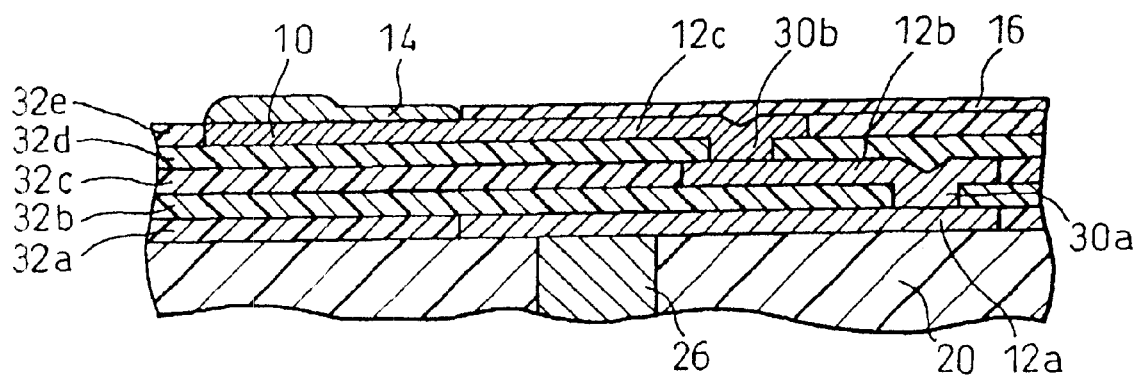
FIG. 7 illustrates a third embodiment of the surface-mounting substrate according to the invention.
Figure 8:
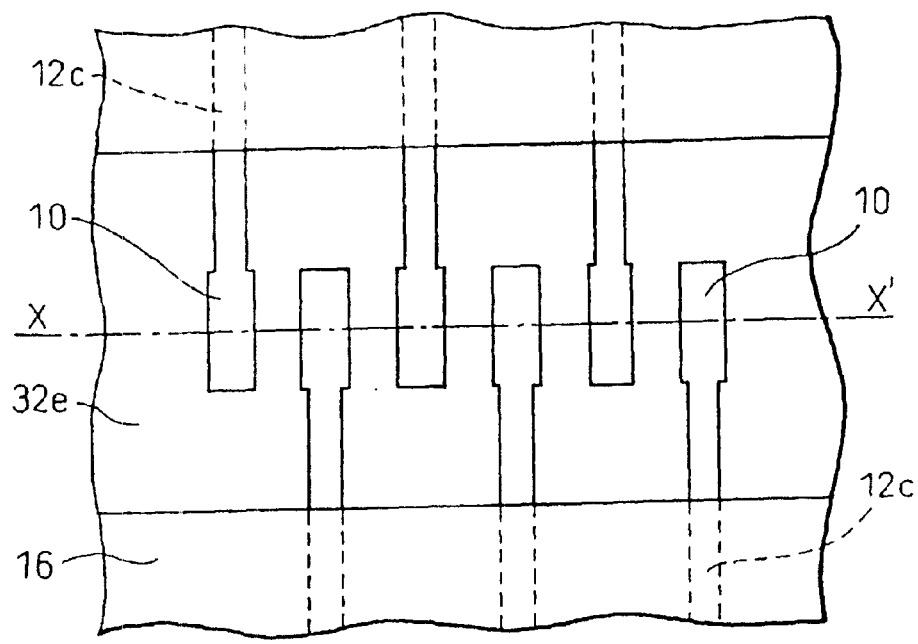
FIG. 8 illustrates a substrate which has a layer of solder resist covering top wiring lines and exposing connecting terminals.

FIG. 7 illustrates a third embodiment of the surface-mounting substrate according to the invention. The substrate in this embodiment is characterized in that the connecting terminals 10 having the exposed top face and the patterned wiring lines 12c extending from the terminal 10 are formed in the same layer. The patterned terminals 10, wiring lines 12a, 12b, 12c, and vias 30a, 30b shown in the drawing are also formed by a fully-additive process so as to be filled in the insulation layers 32a to 32e, as in the former embodiments illustrated in FIGS. 1 and 5. In the third embodiment, however, both connecting terminals 10 and wiring lines 12c are formed in the outermost layer 32e to have the exposed top faces, and a layer of a coating material 16, such as a solder resist, is provided so as to cover the outermost wiring lines 12c and leave the connecting terminals 10 exposed for the subsequent coating of the solder material 14 thereto, as depicted in FIG. 7. FIG. 8 illustrates the substrate having the layer of solder resist 16 which covers the wiring lines 12c and exposes the connecting terminals 10.

In this embodiment, since the top faces of the connecting terminals 10 and the outermost wiring lines 12c are located at substantially the same plane as that at which the surface of the outermost insulation layer 32e is located, the layer of solder resist 16 can be formed to cover only the top faces of the wiring lines 12c and not the sides thereof, and it is enough for the layer of solder resist 16 to have a thickness of the order of 10 micrometers. Thus, the layer of solder resist 16 may have a much smaller thickness compared to that of a layer of solder resist used in a conventional surface-mounting substrate, which is required to have a thickness of about 40 micrometers at the region covering the outermost insulation layer in terms of the thickness of wiring line having exposed sides to be covered with the layer of solder resist, as earlier described.

Figure 9:
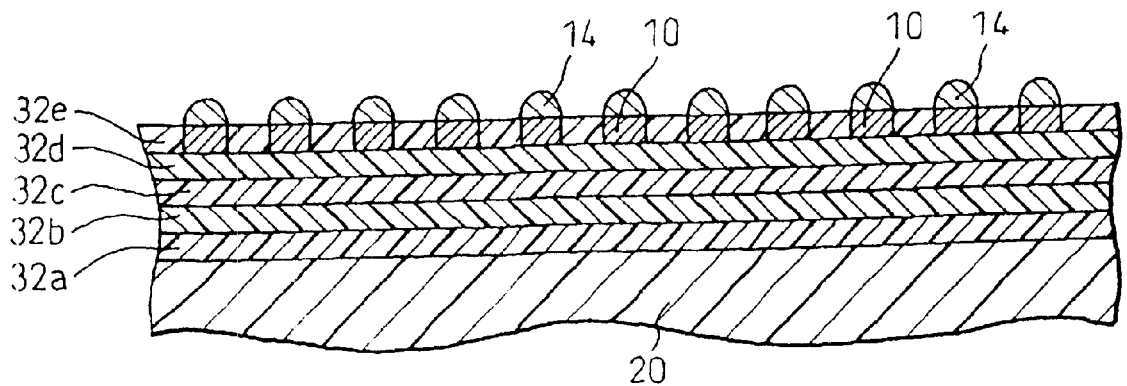
FIG. 9 is an illustration of the substrate illustrated in FIG. 7, showing solder materials on connecting terminals.

Since the connecting terminals 10 in this embodiment are also exposed only at the top faces, the embodiment also has an effect on the prevention of short-circuit between the adjacent terminals 10 due to the bridging of solder materials provided on the terminals 10. FIG. 9 illustrates the substrate of the third embodiment having the solder materials 14 separately coated only to the top faces of the respective connecting terminals 10.

The surface-mounting substrate of the invention may include a layer of wiring lines and vias connected to the wiring lines formed together in one step. For example, referring to FIG. 7, the intermediate layer of wiring lines 12b and the vias 30a connecting the wiring lines 12b to the underlying wiring lines 12a are formed together and, also, the outermost layer of wiring lines 12c and the vias 30b are formed together. As a consequence of the simultaneous formation of the wiring lines and the vias, the resultant vias 30a, 30b have cave-ins at the tops thereof, as shown in FIG. 7. Thus, the surface-mounting substrates according to the invention may include those having such cave-ins in their structures of built-up layers, provided that the cave-ins do not affect the intended functions of the substrates.

As described, the most characteristic feature of the surface-mounting substrate of the invention is that the top faces of the connecting terminals 10a (FIGS. 1 and 5), 10 (FIG. 7), which are exposed at the surface of the substrate, are located at substantially the same plane as that at which the surface of the outermost insulation layer 32g (FIG. 1), 32f (FIG. 5), 32e (FIG. 7) are located, and the sides of the connecting terminals 10a, 10 are buried in the outermost insulation layer 32g, 32f, 32e. As long as this feature is achieved, the formation of the connecting terminals in the outermost layer, and the wiring lines and the vias in various layers of the substrate of the invention may be carried out using any process other than the fully-additive process set forth above.

Figure 10:
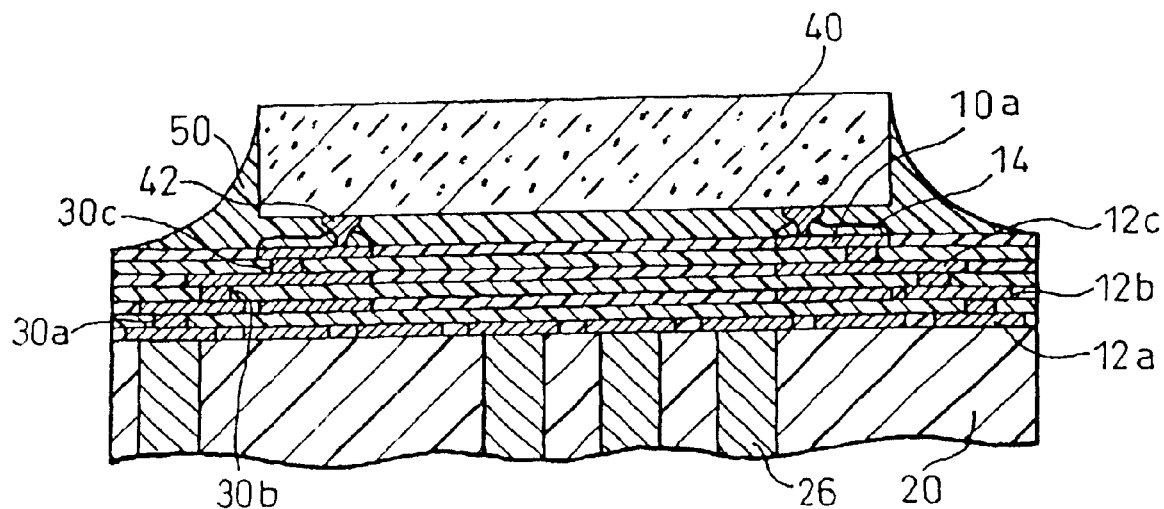
FIG. 10 illustrates a structure comprising the substrate of the first embodiment and a semiconductor device mounted thereon.
Figure 11:
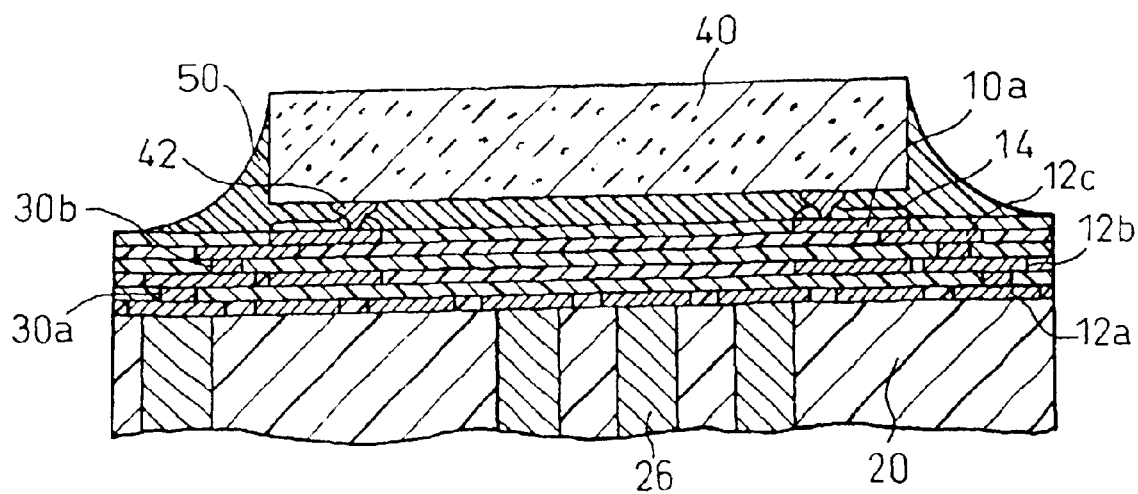
FIG. 11 illustrates a structure comprising the substrate of the second embodiment and a semiconductor device mounted thereon.
Figure 12:
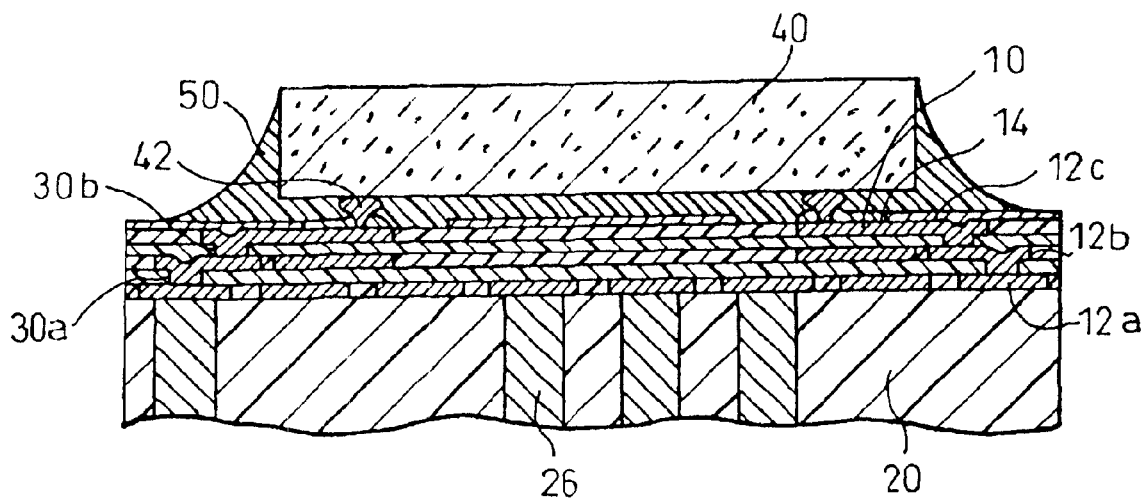
FIG. 12 illustrates a structure comprising the substrate of the third embodiment and a semiconductor device mounted thereon.

FIGS. 10, 11, and 12 respectively illustrate the substrates of the foregoing three embodiments on which semiconductor devices 40 are mounted. In the structures comprising the substrate and the device mounted thereon shown in the drawings, reference numeral 42 indicates a gold bump provided on the semiconductor device 40, and 50 indicates an under-fill material mainly filled in the space between the substrate and the mounted device 40. The other members depicted in the drawings are as earlier described.

Figure 13:
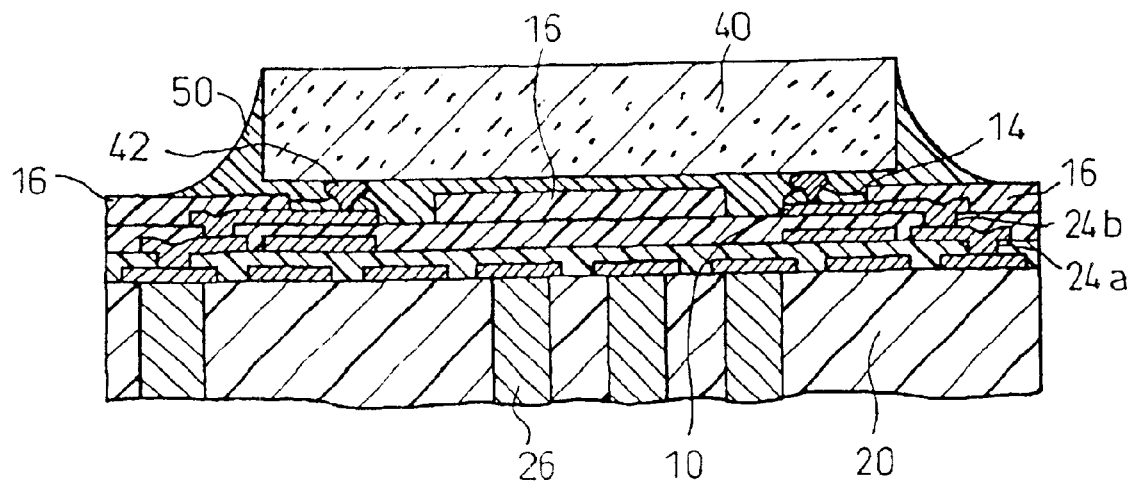
FIG. 13 shows a structure comprising a conventional substrate and a device mounted thereon.
Figure 21:
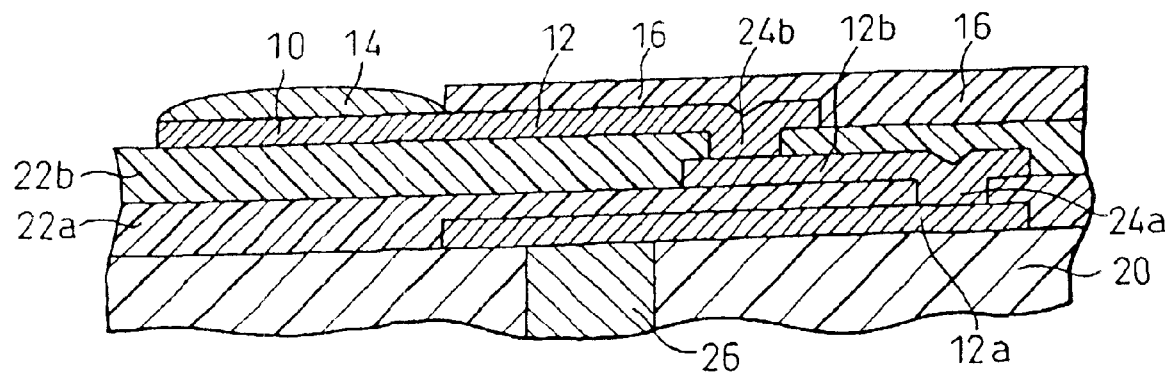
FIG. 21 illustrates a construction of the laminate structure of insulation layers and wiring line layers in a conventional surface-mounting substrate.
Figure 22:
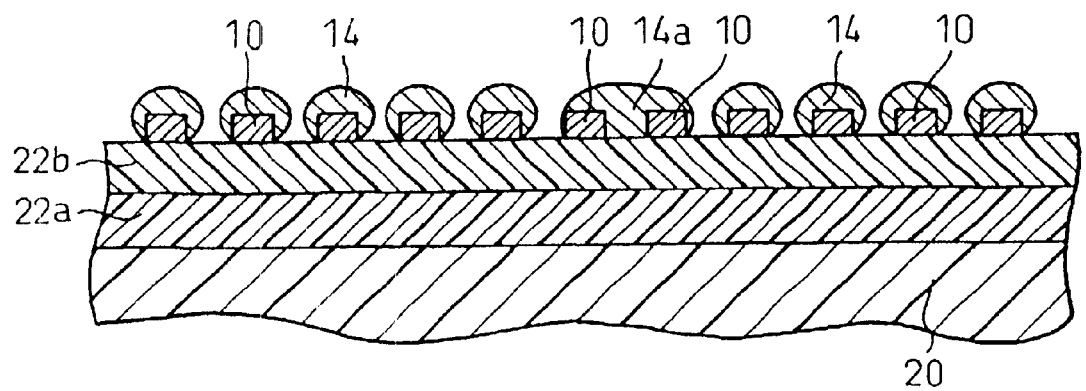
FIG. 22 illustrates a conventional substrate having bridged solder materials.

For comparison, an example of a conventional surface-mounting substrate, as illustrated in FIG. 21, on which a semiconductor device 40 is also mounted, is shown in FIG. 13. The members depicted in the drawing are as earlier described. In this structure comprising the substrate and the device mounted thereon, the connecting terminals 10 project by their thickness over the surface of the substrate. Consequently, the structure has problems that the adjacent connecting terminals 10 tend to be short-circuited due to solder materials 14 coated to the respective terminals 10 if the space distance between the adjacent terminals 10 becomes smaller, and that the layer of the solder resist 16 must be formed in a large thickness and, as a result, the spacing distance between the surface of the layer of the solder resist 16 and the bottom of the semiconductor device 40 becomes smaller, which makes it difficult to fill the under-fill material 50 in the space therebetween.

In the structures comprising the substrate and the semiconductor device mounted thereon as set forth above, it is necessary to mount the device on the substrate in such a manner that complete electrical connection is established between the substrate and the mounted device. When flip chip bonding is used to mount the device on the substrate, the planarity of the surface of the mounting substrate is particularly important for the complete electrical connection between the substrate and the device.

Figure 14:
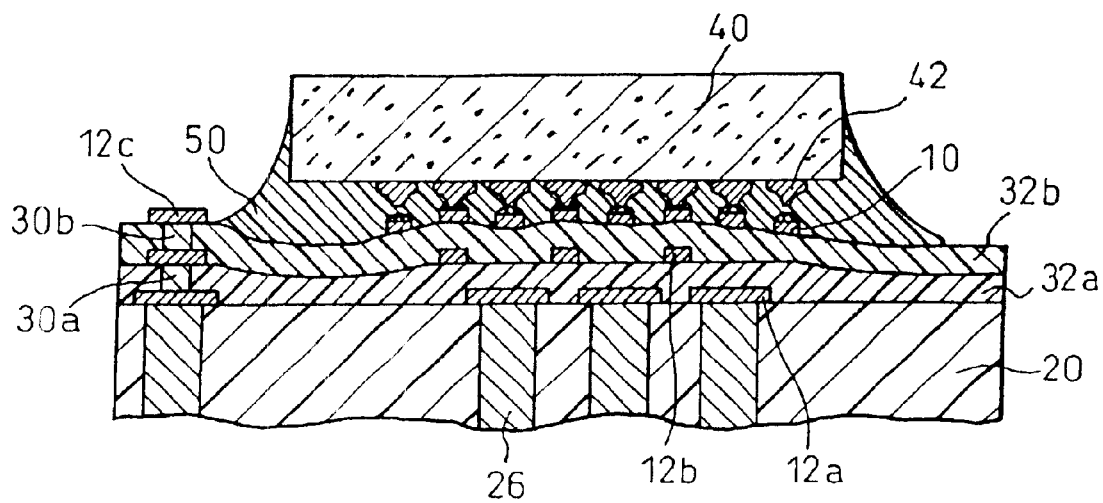
FIG. 14 shows another structure comprising a conventional substrate and a device mounted thereon, with the substrate having a degraded surface planarity.

FIG. 14 illustrates a structure comprising a conventional mounting substrate, which has wiring lines 12a, 12b located at different layers and at non-uniform densities, and a semiconductor device 40 mounted thereon, and shows a degraded planarity of the surface of the substrate as indicated by an undulated configuration of the surface. The degraded planarity results from the ununiformity in densities of the patterned wiring lines 12a, 12b, which causes variation in thickness of each of insulation layers 32a, 32b according to the presence or absence of the underlying wiring lines 12a or 12b.

Figure 15:
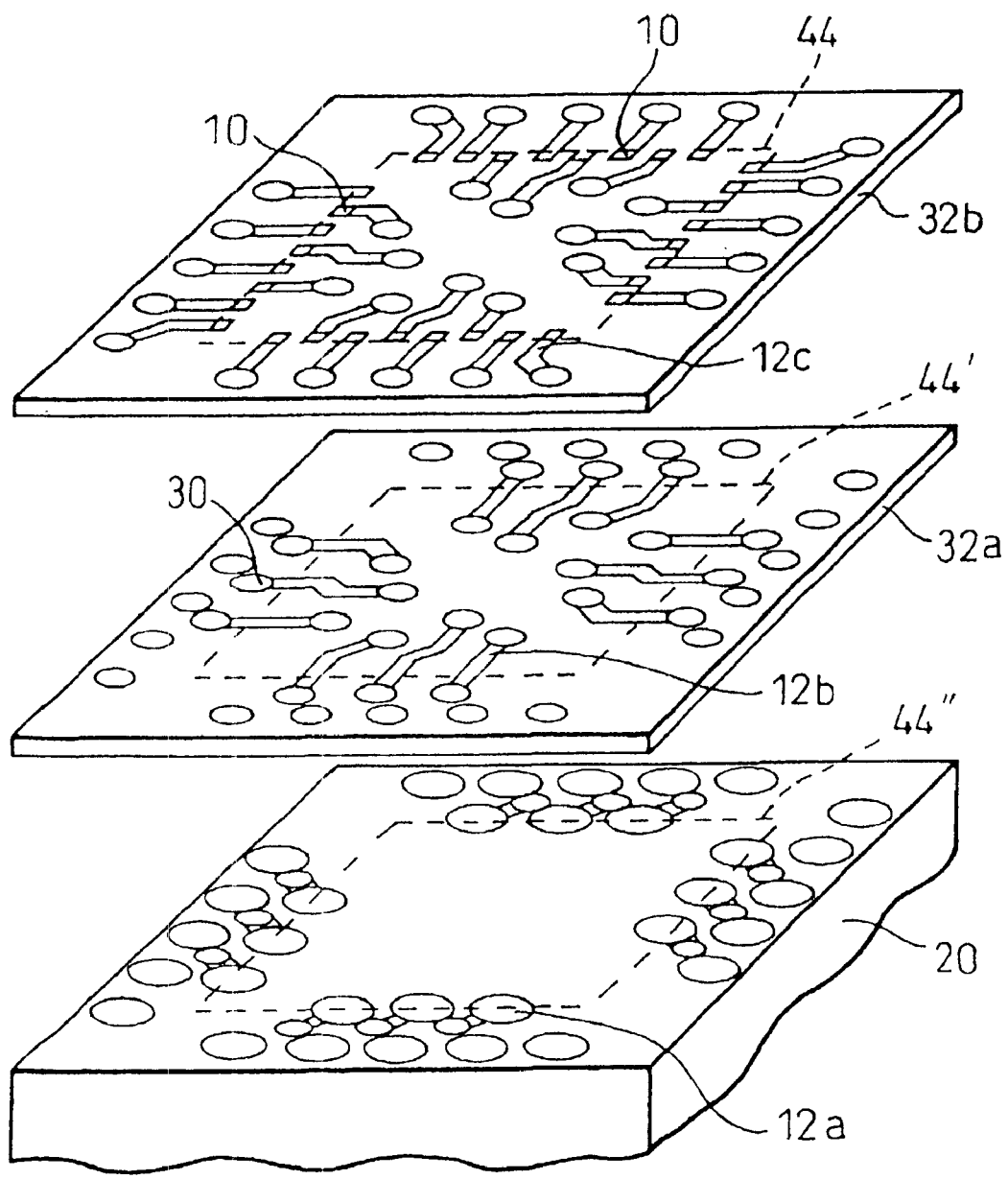
FIG. 15 illustrates arrangements of patterned wiring lines in different layers of a conventional surface-mounting substrate.

FIG. 15 shows arrangements of the patterned wiring lines 12a, 12b, 12c of the respective layers in the structure illustrated in FIG. 14. In the drawing, areas in the respective layers over which the semiconductor device 40 is mounted are indicated by 44, 44', and 44", respectively.

In conventional surface-mounting substrates, layers of patterned wiring lines are designed based only on wiring schemes, line widths, and line gaps in the respective layers, so that the resultant layers have variation in density of wiring lines formed, as shown in FIG. 15, and eventually bring undulated configuration of the surface of a product substrate.

Figure 16:
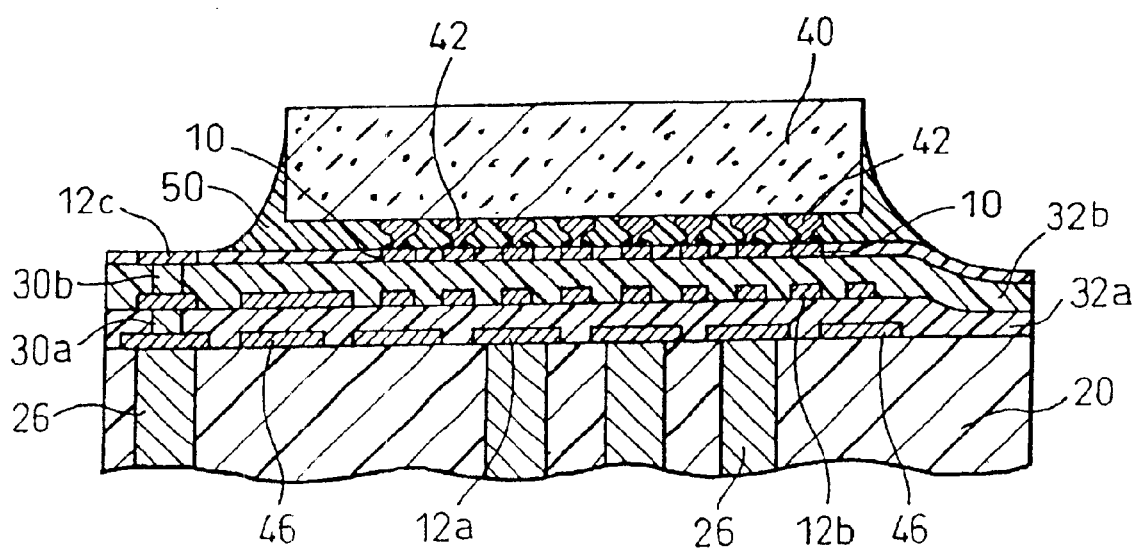
FIG. 16 illustrates a structure comprising a substrate of the invention and a semiconductor device mounted thereon.

FIG. 16 illustrates a structure comprising a mounting substrate, as an embodiment of the invention as described above, and a semiconductor device 40 mounted thereon, which is obtained by designing layers of patterned wiring lines 12a, 12b, 12c in the substrate taking the densities thereof into account so that each of the insulation layers 32a, 32b to be interposed between the adjacent layers of wiring lines is formed to be uniform in thickness as a whole.

Figure 17:
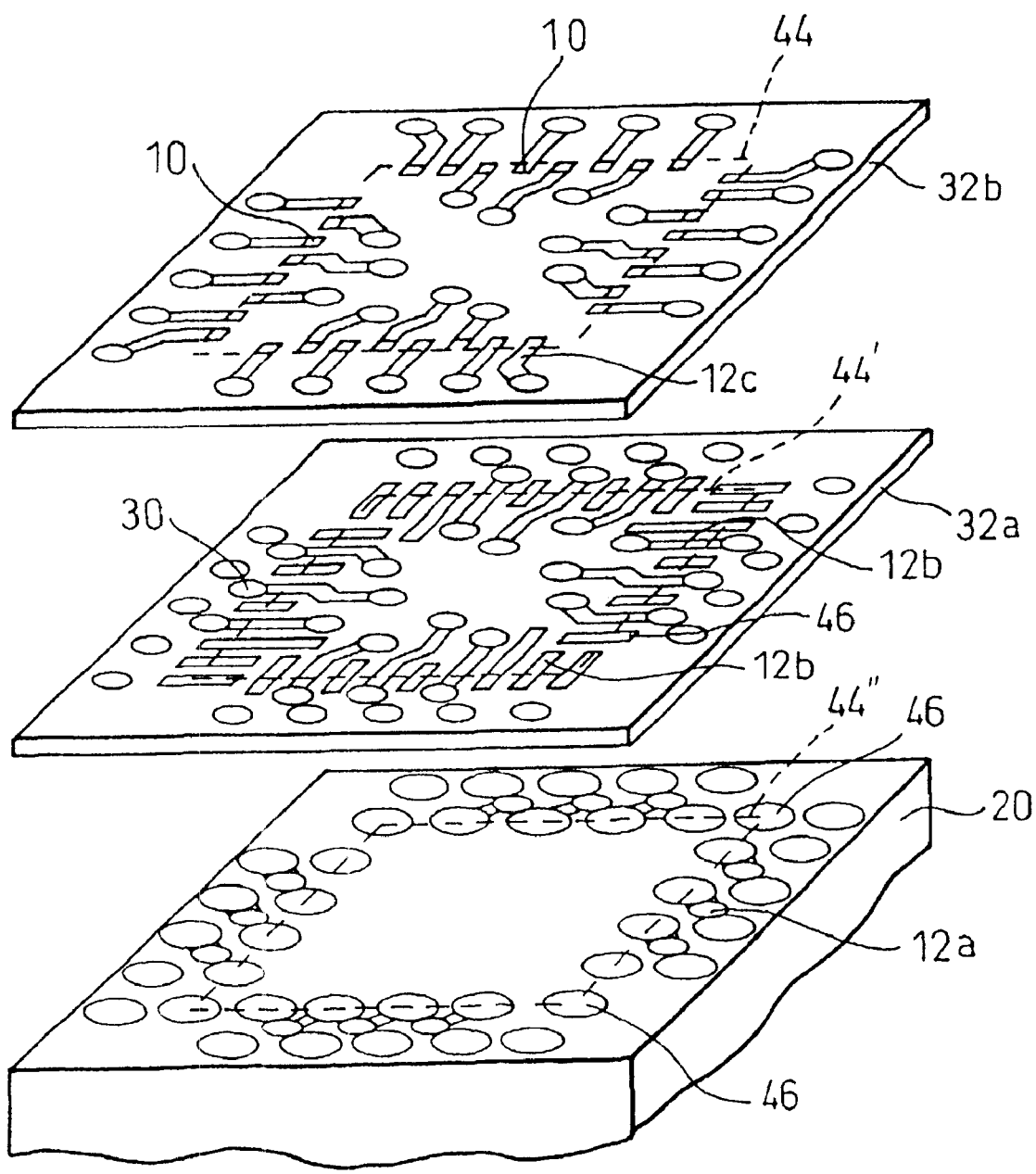
FIG. 17 illustrates arrangements of patterned wiring lines in different layers of a surface-mounting substrate of the invention.

FIG. 17 shows arrangements of the patterned wiring lines 12a, 12b, 12c of the respective layers in the structure illustrated in FIG. 16. In the drawing, areas in the respective layers over which the semiconductor device 40 is mounted are indicated by 44, 44', and 44", respectively.

In this embodiment of the invention, dummy members 46 are located at the layers of wiring lines 12a and 12b, as shown in FIG. 16. The dummy members 46, which are separate and are not connected to other wiring line or via in the mounting substrate, but may be grounded, exclusively contribute to equalization of density of wiring lines at each of the layers 12a and 12b, and can be formed concurrently with the formation of the respective layers of wiring lines 12a and 12b. Thus, the structure of the embodiment is free of the problem of undulated surface configuration of the mounting substrate.

In the surface-mounting substrate having wiring lines at the same density, vias 30a, 30b provided in the respective insulation layers 32a, 32b have, in general, a diameter of 0.05 to 0.6 millimeter. The wiring lines 12b, 12c, which connects a via 30a, 30b to a through hole 26 or another via 30a, 30b, are formed to have a width of 20 to 200 micrometers, and are arranged at a pitch of 60 to 300 micrometers, in general.

The surface-mounting substrate of the invention may have a through hole to connect a wiring line at one side of the substrate to another wiring line at the other side thereof, as required, as schematically shown in the drawings referred to above. Such a through hole has, in general, a diameter of 0.2 to 0.6 millimeter. If a substrate has a plurality of thorough holes, they are arranged in a pitch of 0.5 to 1.5 millimeters, in general.

By making a density of patterned wiring lines in a mounting substrate as uniform as possible, it is possible to provide an insulation layer with a uniform thickness, and to provide a product substrate with a planar surface. A uniform arrangement of patterned wiring lines may be obtained by the use of dummy members as referred to above. Alternatively, when a mounting substrate has a common plane, such as a power supply plane or grounding plane, a uniform arrangement of wiring lines may also be obtained by use of a common plane formed in a mesh-like shape or having numerous slits. The method of obtaining uniformly arranged wiring lines is not limited to those referred to above.

The uniformly arranged wiring lines not only have an effect in restraining variation in thickness of an insulation layer to thereby provide a mounting substrate with a planar surface, but also have a significant effect in firmly bonding gold bumps 42 of the semiconductor device 40 (FIG. 16) to the connecting terminals 10 of the substrate when the bonding is performed by flip chip bonding. In flip chip bonding, both of a device and a substrate are heated, and the device is pressed on and bonded to the substrate, and, during the heating, insulation layers in the substrate are also heated, and are deformed under the influence of heat. The uniformly arranged wiring lines are useful to avoid such deformation of insulation layers under a heated environment.

Figure 18A:
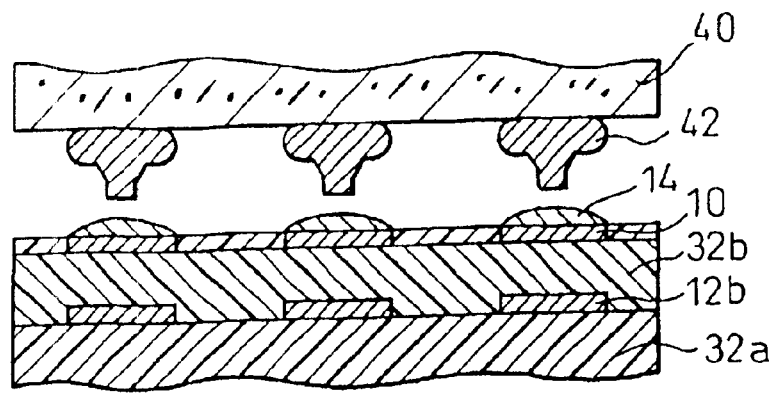
FIGS. 18A to 18C illustrate the mounting of a semiconductor device to a substrate comprising wiring lines formed in the layers at the same density.
Figure 18B:
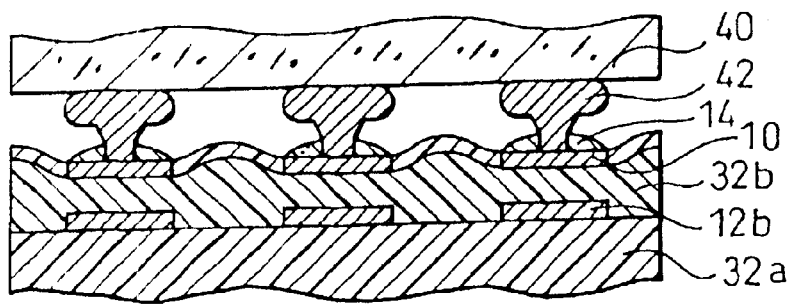
Figure 18C:
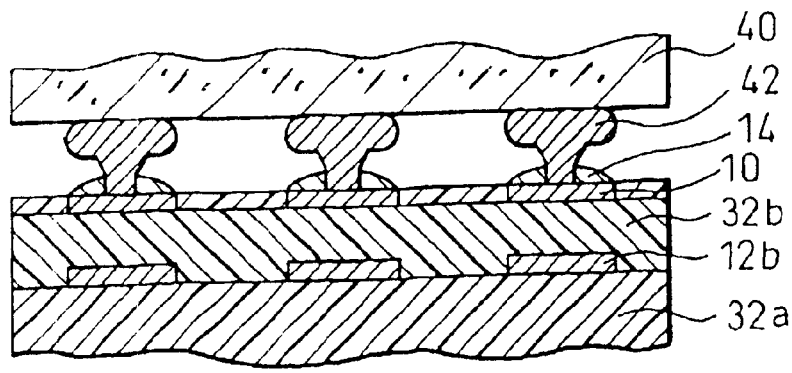

FIGS. 18A to 18C and FIGS. 19A to 19C illustrate the flip chip bonding of a semiconductor device 40 to a surface-mounting substrate. The substrate shown in FIGS. 18A to 18C represents an example of substrate comprising wiring lines, which include herein wiring lines 12b in the lower layer as well as connecting terminals 10 in the upper layer, formed in the respective layers at the same density. In this case, the wiring lines 12b are located under the respective corresponding connecting terminals 10, which are arranged in a pattern similar to a pattern of bumps 42 (made of gold, for example) of the device 40 to be mounted on the substrate. The substrate shown in FIGS., 19A to 19C represents an example of substrate having wiring lines 12b in the lower layer and connecting terminals 10 in the upper layer, which are formed in the respective layers at densities which are different from one layer to another. In this case, all of the terminals 10 are not located above the wiring lines 12b.

There is a difference in thermal conductivity between the insulation layers in the cases illustrated in FIGS. 18A to 18C and FIGS. 19A to 19C. In the case where conductive members of the wiring lines 12b and the connecting terminals 10 in the adjacent layers are arranged at the same density, as in FIGS. 18A to 18C, heat applied to the substrate during a heating process can be efficiently diffused through the conductive members to thereby restrict excessive temperature rise in the insulation layers 32a, 32b. In contrast, in the case where the conductive members in the adjacent layers are arranged at densities different from one layer to another, as in FIGS. 19A to 19C, the insulation layers are locally at an increased temperature and can exceed its elastic deformation limit at the locations where the conductive members are not present.

Figure 19A:
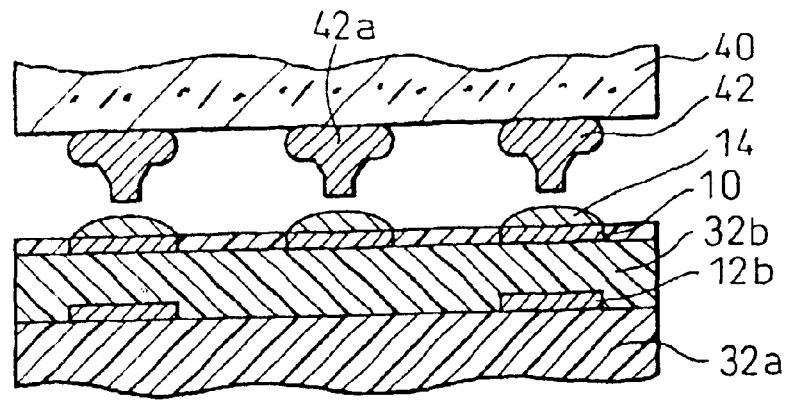
FIGS. 19A to 19C illustrate the mounting of a semiconductor device to a substrate comprising wiring lines formed in different layers at densities which are different from one layer to another.
Figure 19B:
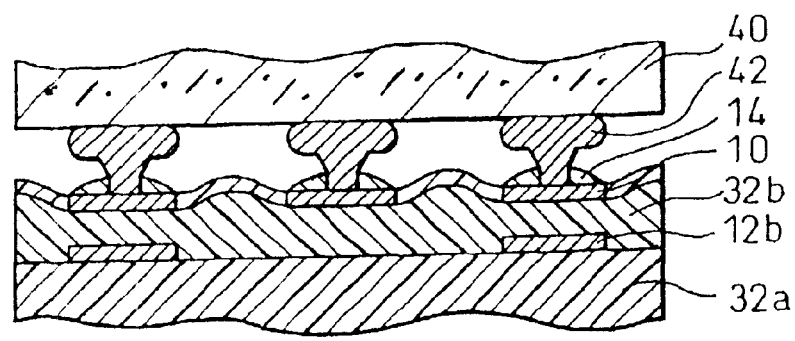

Specifically, referring to FIGS. 18A and 19A, these drawing show the substrate and the device 40 before bonding, with the substrate and the device facing each other so that the bumps 42 of the device 40 are aligned with the connecting terminals 10 of the substrate. FIGS. 18B and 19B show the bumps 42 of the device 40 pressed on the respective connecting terminals 10 of the substrate. By the pressing, and heat which is applied during the pressing, solder material 14 on the terminal 10 is melted, and the end of the bump 42 is in contact with the terminal 10 to thereby indirectly press the underlying insulation layer 32b. As a result, the insulation layer 32b, which is also heated by the applied heat to be softened, is dented to some extent.

Figure 19C:
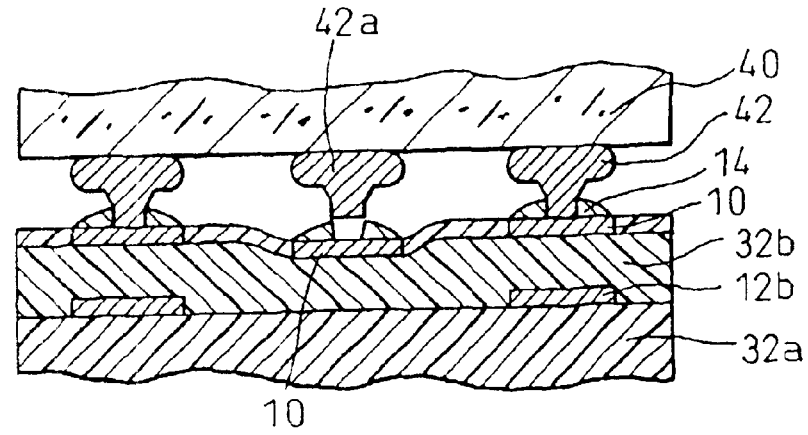

FIGS. 18C and 19C illustrate structures comprising the substrate and the mounted device 40 which are returned to a normal temperature after the bonding. In the structure shown in FIG. 18C, the uppermost insulation layer 32b, which was dented in the conditions illustrated in FIG. 18B, is restored to have a planar surface, and the bumps 42 of the device 40 are all bonded to the respective connecting terminals 10 of the substrate. In contrast, in the structure shown in FIG. 19C, the insulation layer 32b is not restored to have a planar surface, and locally deformed so that the bump 42a, which was pressed to the bump from under which a wiring line is absent in the conditions illustrated in FIG. 19B, is separated and electrically isolated from the terminal 10. It is believed that such local deformation of the insulation layer 32b originates in the layer 32b being pressed during the flip chip bonding to be deformed, and is left deformed after cooled to a normal temperature at the location loaded with the terminal 10, under which the wiring line 12b is absent. This phenomenon is understood in terms of a glass transition point of the insulation layer 32b, as discussed below.

As the metal material (solder material) for bonding the bumps 42 of the device 40 to the connecting terminals 10 of the mounting substrate, a material having a high melting point of, for example, 260° C. or even 280° C., may be used. Such a metal material having a high melting point needs to be heated to a high temperature during the flip chip bonding of the device to the substrate, accordingly. When a device is mounted on a substrate having wiring lines 12b in the lower layer and connecting terminals 10 in the upper layer formed at densities different from one layer to another, by the use of the high melting-point material, a larger amount of heat is accumulated at portions of the insulation layers where the wiring line is not present than at portions of the insulation layers where the wiring lines are present, and the former portions have an increased temperature. By way of example, when a substrate is placed in an atmosphere of a temperature of the order of 260° C., insulation layers are reduced in temperature to about 150° C. at the locations where wiring lines, which are good conductor of heat, are provided, and only to about 220° C. at the locations where no wiring lines are present. In general, a resinous material, such as those used for the insulation layers in the mounting substrate of the invention, is permanently set at a temperature higher than its glass transition temperature (Tg), and is elastically deformed at a temperature not higher than Tg. Accordingly, in the case where a material having a glass transition temperature of between 150° C. and 220° C. is used for insulation layers in a mounting substrate, the surface of the insulation layer is restored to be planar after heating, as illustrated in FIG. 18C, when the insulation layer reaches a temperature not higher than the glass transition temperature during the heating, and is not restored to be planar and locally left deformed after heating, as illustrated in FIG. 19C, when the insulation layer reaches a temperature exceeding the glass transition temperature during the heating.

Thus, it is preferred that patterns of the layers of wiring lines in the mounting substrate of the invention are designed taking into account the effects of pressing and heating during flip chip bonding as discussed above so that heat can be efficiently dissipated, during the flip chip bonding, from locations of the insulation layer, which receive the effect of pressing by the bumps of the device mounted on the substrate and are not provided with the wiring lines, by providing additional members, such as dummy members 46 illustrated in FIG. 17, at those locations. Such a design of the layers of wiring lines contributes to providing a mounting substrate having a mounting surface of good planarity, and also for providing a highly reliable structure comprising a substrate and a device mounted thereon, in which device is firmly mounted on the substrate without disconnection between bumps of the device and connecting terminals of the substrate.

As illustrated in FIGS. 16 to 18, the surface-mounting substrate used in the structure of the invention may be a type of substrate described above referring to FIGS. 1 to 12, in which the connecting terminals are filled in an outermost insulation layer provided at the surface of the surface-mounting substrate, and has a surface exposed at substantially the same level as the level of the surface of the outermost insulation layer, and in which conductive members in an area, over which the part is mounted, of the outermost layer of wiring lines connected with the connecting terminals are arranged at a uniform density as a whole. As described earlier, this type of surface-mounting substrate is particularly useful to prevent electrical short-circuit between adjacent connecting terminals due to bridging of solder materials.

As will be easily understood by a person with ordinary skill in the art, in some cases, for example, a case where the bridging of solder materials on adjacent connecting terminals does not take place even if a type of substrate described referring to FIGS. 1 to 12 is not used, the surface-mounting substrate used in the structure of the invention may also be a substrate in which the connecting terminals are not filled in an outermost insulation layer, and which is simply characterized in that conductive members in an area, over which the part is mounted, of an outermost layer of wiring lines are arranged at a uniform density as a whole.

Thus, in another aspect, the invention provides a surface-mounting substrate for mounting thereon a part, such as a semiconductor device, which comprises a core substrate, a plurality of layers of patterned wiring lines, which are separated from each other by an insulation layer interposed therebetween, vias piercing through the insulation layer to connect the wiring lines at the adjacent layers to each other, and a layer of connecting terminals to mount a part on the surface-mounting substrate, wherein conductive members in an area, over which the part is mounted, of an outermost layer of wiring lines are arranged at a uniform density as a whole.

Figure 23:
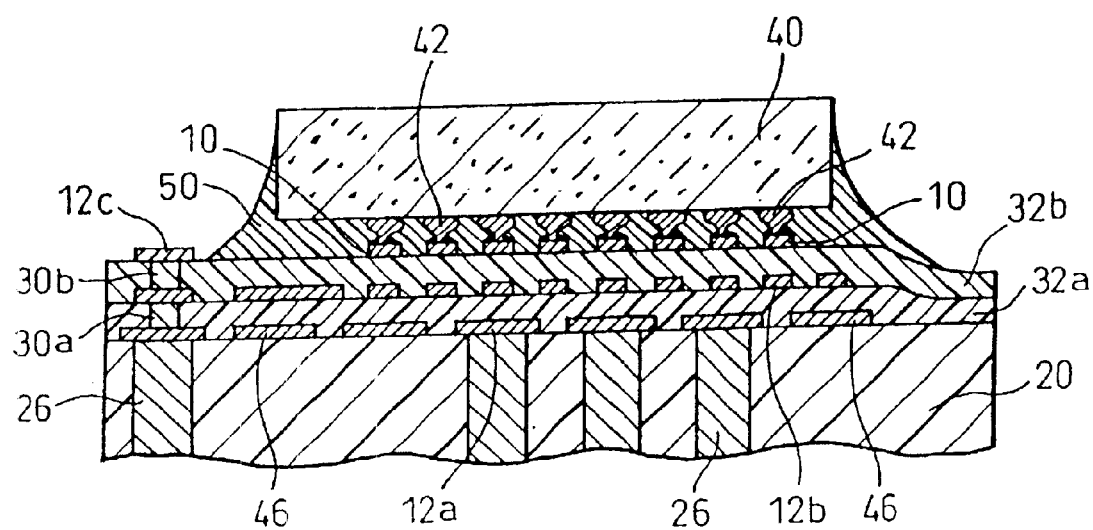
FIG. 23 illustrates a further structure of the invention comprising a substrate and a semiconductor device mounted thereon.
Figure 24A:
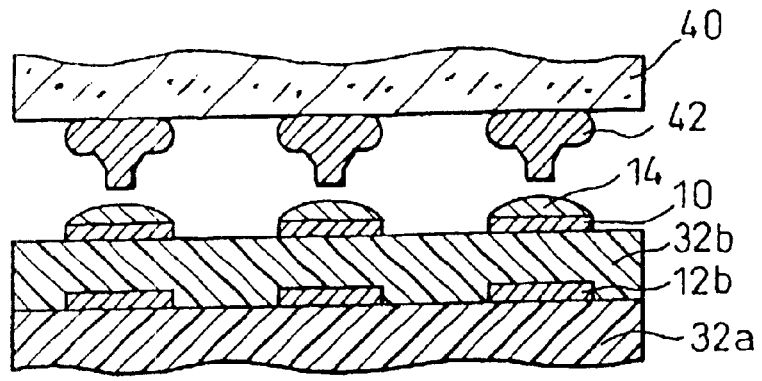
FIGS. 24A to 24C illustrate the mounting of a semiconductor device to a substrate comprising wiring lines formed in the layers at the same density.
Figure 24B:
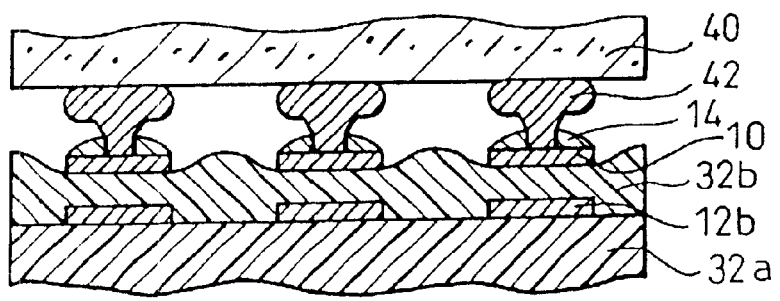
Figure 24C:
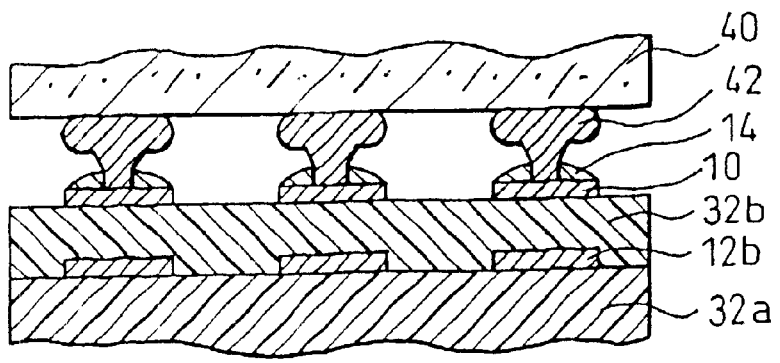
Figure 25A:
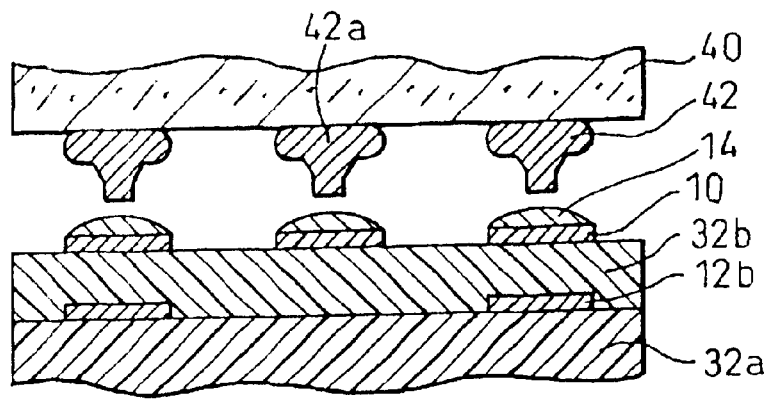
FIGS. 25A to 25C illustrate the mounting of a semiconductor device to a substrate comprising wiring lines formed in different layers at densities which are different from one layer to another.
Figure 25B:
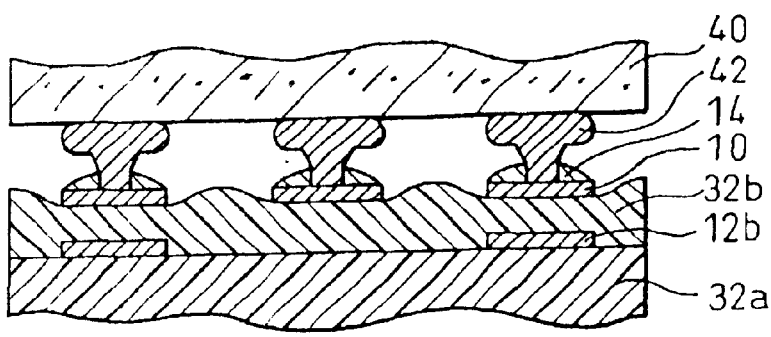
Figure 25C:
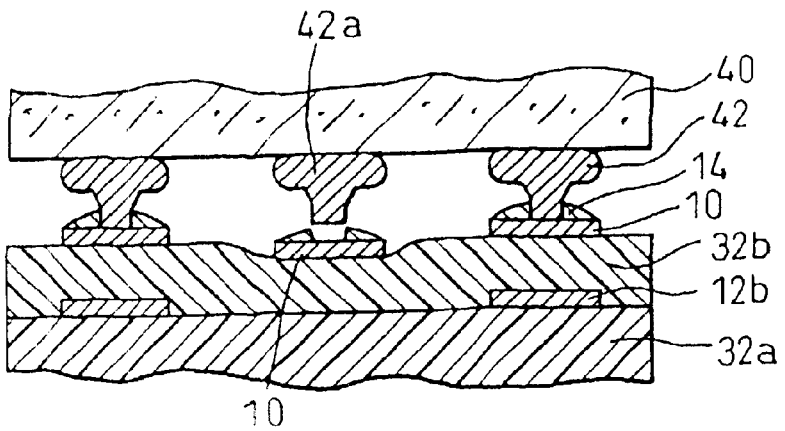

The structure of this aspect of the invention is illustrated in FIG. 23, which is analogous to FIG. 16, except that the terminals 10 of the surface-mounting substrate project over the outermost insulation layer 32*b*. Likewise, the mounting of a semiconductor device to a substrate comprising wiring lines formed in the different layers at the same density, and the mounting of a semiconductor device to a substrate comprising wiring lines formed in different layers at densities which are different from one layer to another, are illustrated in FIGS. 24A to 24C and FIGS. 25A to 25C, which are analogous to FIGS. 18A to 18C and FIGS. 19A to 19C, respectively, except that the terminals 10 of the surface-mounting substrate also project over the outermost insulation layer 32*b*. The mechanism of deformation and subsequent complete restoration (FIG. 24C) or partial restoration (FIG. 25C) of the configuration of the insulation layer 32*b* is the same as the mechanism described above referring to FIGS. 18A to 18C and FIGS. 19A to 19C, having no relation to whether or not the terminals 10 of the surface-mounting substrate project over the outermost insulation layer 32*b*.

As described, the invention can provide a surface-mounting substrate in which electrical short-circuit between adjacent connecting terminals due to bridging of solder materials coated to the terminals can be prevented even when the connecting terminals are arranged at a very small distance, and variation in thicknesses of the solder materials due to variation in thickness (height) of the terminals can be also prevented, and which can adapt to the mounting of a miniaturized semiconductor device having an increased number of connecting pins. The invention can also provide a surface-mounting substrate having a good surface planarity which improves reliability of electrical connection between bumps of a device mounted and connecting terminals of the substrate. In addition, the invention can provide a highly reliable structure comprising a surface-mounting substrate and a device mounted thereon, in which firm electrical connection between the device and the substrate is established, and which can be produced at a high yield.

What is claimed is:

1. A surface-mounting substrate for mounting a part thereon, which comprises a core substrate, a plurality of layers of patterned wiring lines, which are speareated from each other by an insulation layer interposed therebetween, vias piercing through the insualtion layer to connect the wiring lines at the adjacent layers to each other, and a layer of connecting terminals to mount a part on the surface-mounting substrate, each of the connecting terminals connecting with the wiring line at the outermost layer of wiring lines, wherein the connecting terminal is filled in an outermost insulation layer provided at the surface of the surface-mounting substrate, and has a surface exposed at substantially the same level as the level of the surface of the outermost insulation layer, the connecting terminal being provided on its surface with solder material.

2. The surface-mounting substrate of claim 1, wherein the part to be mounted is a semiconductor device.

3. The surface-mounting substrate of claim 1, wherein the connecting terminal is directly connected with the wiring line at the outermost layer in the surface-mounting substrate, and the wiring lines at the outermost layer are covered with a cover material.

4. The surface-mounting substrate of claim 3, wherein the cover material is a solder resist.

5. A structure comprising a surface-mounting substrate and a part mounted thereon, the surface-mounting substrate comprising a core substrate, a plurality of layers of patterned wiring lines, which are separated from each other by an insulation layer interposed therebetween, vias piercing through the insulation layer to connect the wiring lines at the adjacent layers to each other, and a layer of connecting terminals to mount the part on the surface-mounting substrate, each of connecting terminals connecting with the wire line at the outermost layer of wiring lines, and the part having bumps, and being mounted on the substrate through the bumps bonded to the respective connecting terminals, wherein the connecting terminal of the surface-mounting substrate is filled in an outermost insulation layer provided at the surface of the surface-mounting substrate such that the entire surface of a connecting terminal is exposed at the surface of the mounting substrate, and has a surface exposed at substantially the same level as the level of the surface of the outermost insulation layer, the connecting terminal being provided on its surface with solder material.

6. The structure of claim 5, wherein the part to be mounted is a semiconductor device and wherein at least one of said layers of patterned wiring lines is a dummy layer.

7. The structure of claim 5, wherein conductive members in an area, over which the part is mounted, of the outermost layer of wiring lines connected with the connecting terminals are arranged at a uniform density as a whole.

8. The structure of claim 7, wherein the conductive members at each of the layers of wiring lines below the outermost layer of wiring lines are arranged at substantially the same density as the density of conductive members at the outermost wiring lines.

9. The surface-mounting substrate of claim 1, wherein the wiring lines of the respective wiring line layers below the connecting terminals are arranged at the same density as the density of connecting terminals so as to be each located under a respective connecting terminal.

10. The surface-mounting substrate of claim 1, wherein the connecting terminals are arranged at a pitch of 100 micrometers or smaller and at a distance between the terminals of 200 micrometers or larger.

11. The surface-mounting substrate of claim 1, wherein conductive members in an area, over which the part is mounted, of the outermost layer of wiring lines connected with the connecting terminals are arranged at a uniform density as a whole.

12. The surface-mounting substrate of claim 11, wherein the conductive members include the wiring lines and the connecting terminals.

13. The surface-mounting substrate of claim 11, wherein the conductive members at each of the layers of wiring lines below the outermost layer of wiring lines are arranged at substantially the same density as the density of conductive members at the outermost wiring lines.

14. The surface-mounting substrate of claim 11, which has dummy members at at least one of layers of wiring lines.

15. The surface-mounting substrate of claim 11, wherein the wiring lines have a width of 20 to 200 micrometers, and are arranged at a pitch of 60 to 300 micrometers.

16. The surface-mounting substrate of claim 11, wherein the vias have a diameter of 0.05 to 0.6 millimeter.

17. The surface-mounting substrate of claim 11, wherein the core substrate has through holes to connect a wiring line at one side of the substrate to another wiring line at the other side, the through holes having a diameter of 0.2 to 0.6 millimeter, and being arranged in a pitch of 0.5 to 1.5 millimeters.

18. The surface-mounting substrate of claim 1, wherein conductive members in the area, over which the part is mounted, of each of the layers of wiring lines located below the outermost layer of wiring lines connected with the connecting terminals are arranged at a uniform density as a whole.

19. The surface-mounting substrate of claim 18, wherein the conductive members include the wiring lines and the vias.

20. The surface-mounting substrate of claim 19, wherein the conductive members further include a power supply plane and/or a grounding plane.

21. The surface-mounting substrate of claim 20, wherein the power supply plane and/or the grounding plane is in a mesh-like shape or has slits.

22. The surface-mounting substrate of claim 18, which has dummy members at at least one of layers of wiring lines.

23. The surface-mounting substrate of claim 18, wherein the wiring lines have a width of 20 to 200 micrometers, and are arranged at a pitch of 60 to 300 micrometers.

24. The surface-mounting substrate of claim 18, wherein the vias have a diameter of 0.05 to 0.6 millimeter.

25. The surface-mounting substrate of claim 18, wherein the core substrate has through holes to connect a wiring line at one side of the substrate to another wiring line at the other side, the through holes having a diameter of 0.2 to 0.6 millimeter, and being arranged in a pitch of 0.5 to 1.5 millimeters.

26. The surface-mounting substrate of claim 5, wherein the wiring lines of the respective wiring line layers below the connecting terminals are arranged at the same density as the density of connecting terminals so as to be each located under a respective connecting terminal.

27. The structure of claim 7, wherein the conductive members include the wiring lines and the connecting terminals.

28. The structure of claim 5, wherein conductive members in the area, over which the part is mounted, of each of the layers of wiring lines located below the outermost layer of wiring lines connected with the connecting terminals are arranged at a uniform density as a whole.

29. The structure of claim 28, wherein the conductive members include the wiring lines and the vias.

* * * * *